US012610557B2

(12) United States Patent
Ambrosi et al.

(10) Patent No.: US 12,610,557 B2
(45) Date of Patent: Apr. 21, 2026

(54) MEMORY DEVICE

(71) Applicant: Taiwan Semiconductor Manufacturing Company, Ltd., Hsinchu (TW)

(72) Inventors: Elia Ambrosi, Hsinchu City (TW); Xinyu Bao, Fremont, CA (US); Cheng-Hsien Wu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 491 days.

(21) Appl. No.: 18/152,122

(22) Filed: Jan. 9, 2023

(65) Prior Publication Data

US 2023/0422518 A1 Dec. 28, 2023

Related U.S. Application Data

(60) Provisional application No. 63/405,891, filed on Sep. 13, 2022, provisional application No. 63/355,096, filed on Jun. 24, 2022.

(51) Int. Cl.
*H10B 63/00* (2023.01)
*H10B 61/00* (2023.01)

(52) U.S. Cl.
CPC ............. *H10B 63/24* (2023.02); *H10B 61/10* (2023.02)

(58) Field of Classification Search
CPC ........ H10B 63/24; H10B 61/10; H10B 63/20; H10B 63/84; H10N 70/20; H10N 70/231; H10N 70/826; H10N 70/8828
See application file for complete search history.

(56) References Cited

U.S. PATENT DOCUMENTS

| | | | | |
|---|---|---|---|---|
| 10,497,867 B1 * | 12/2019 | Trinh | .................... | H10N 70/063 |
| 2021/0296400 A1 * | 9/2021 | Ino | ...................... | G11C 13/0004 |
| 2022/0052113 A1 * | 2/2022 | Lee | .................... | H10N 70/8825 |
| 2022/0406844 A1 * | 12/2022 | Kim | ....................... | H10B 63/24 |
| 2023/0088249 A1 * | 3/2023 | Yang | ...................... | H10B 63/10 257/5 |
| 2023/0165171 A1 * | 5/2023 | Tong | .................... | H10N 70/026 257/4 |

* cited by examiner

*Primary Examiner* — Allison Bernstein

(74) *Attorney, Agent, or Firm* — JCIPRNET

(57) ABSTRACT

A memory device is provided. The memory device includes memory cells. Each of the memory cells includes: a resistance variable storage device; and a selector. The selector is stacked with the resistance variable storage device and coupled to the resistance variable storage device with a shared terminal, and includes a switching layer formed of a chalcogenide compound. A thickness of the switching layer is equal to or less than about 5 nm.

20 Claims, 13 Drawing Sheets

MEMORY DEVICE

CROSS-REFERENCE TO RELATED APPLICATION

This application claims the priority benefit of U.S. provisional application Ser. No. 63/355,096, filed on Jun. 24, 2022, and U.S. provisional application Ser. No. 63/405,891, filed on Sep. 13, 2022. The entirety of each of the above-mentioned patent applications is hereby incorporated by reference herein and made a part of this specification.

BACKGROUND

With advances in digital technology, there is a greater demand for a nonvolatile memory device with higher capacity, less writing power, higher writing/reading speed, and longer service life. In order to meet the demand, refinement of a flash memory has been progressed. On the other hand, a resistive nonvolatile memory device including memory cells each having a resistance variable element has been researched and developed.

Recently, one-selector/one-memory (1S1M) configuration is widely implemented in high-density cross-point resistive memory systems. One of the most promising materials for the selector is chalcogenide material. However, large threshold voltage drift is an important issue for the chalcogenide selector technology, and can limit read margin of the cross-point memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
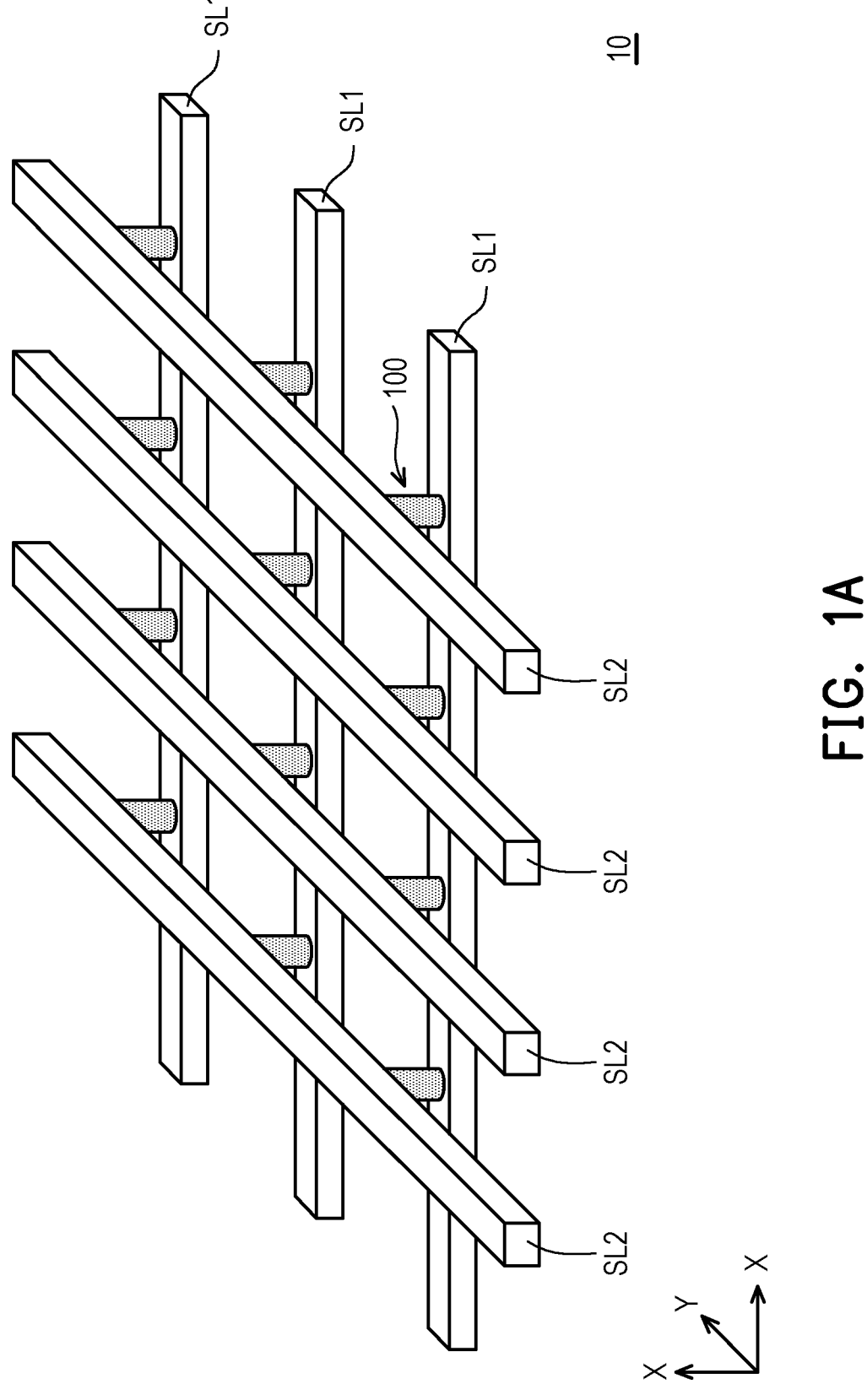
FIG. 1A is a schematic three-dimensional view illustrating a memory array, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic three-dimensional view illustrating a memory array 10, according to some embodiments of the present disclosure.

Referring to FIG. 1A, the memory array 10 includes memory cells 100 arranged along columns and rows. The memory cells 100 in each column are arranged along a direction Y, while the memory cells 100 in each row are arranged along a direction X intersected with the direction Y. The memory cells 100 are defined at intersections of first signal lines SL1 and second signal lines SL2 running over and intersecting with the first signal lines SL1. The first signal lines SL1 may be connected to or functioned as bottom terminals of the memory cells 100, while the second signal lines SL2 may be connected to or functioned as top terminals of the memory cells 100. The first signal lines SL1 may be referred as bit lines, while the second signal lines SL2 may be referred as word lines. Alternatively, the first signal lines SL1 may be referred as word lines, while the second signal lines SL2 may be referred as bit lines. In some embodiments, as shown in FIG. 1A, the first signal lines SL1 extend along the direction Y, while the second signal lines SL2 extend along the direction X. In these embodiments, each first signal line SL1 may connect the bottom terminals of a column of the memory cells 100, or functioned as a common bottom terminal for a column of the memory cells 100. In addition, each second signal line SL2 may connect the top terminals of a row of the memory cells 100, or functioned as a common top terminal for a row of the memory cells 100. However, the extending directions of the first and second signal lines SL1, SL2 may be swapped or altered, as long as the memory cells 100 are formed at intersections of the first and second signal lines SL1, SL2.

Figure 1B:
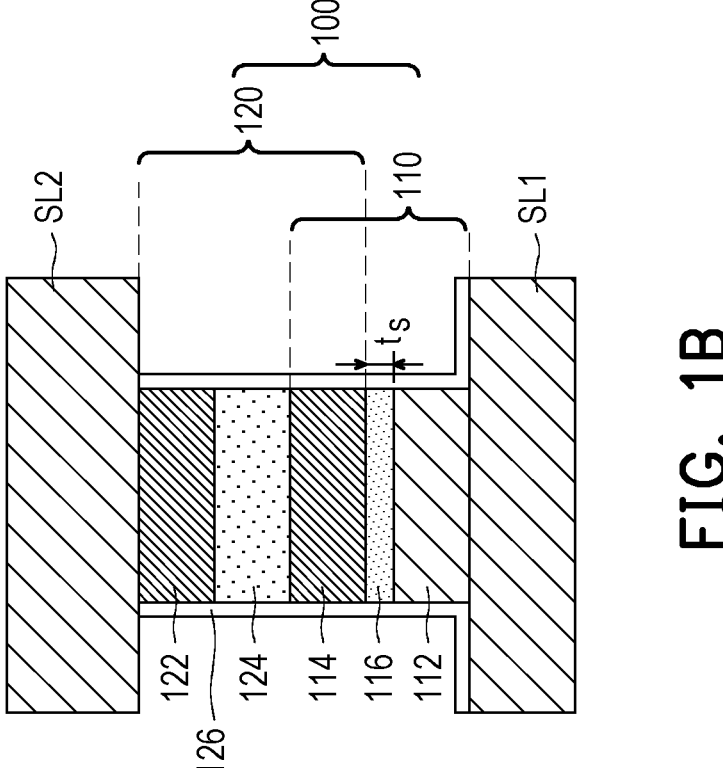
FIG. 1B is a cross-sectional view schematically illustrating a memory cell in a memory array, according to some embodiments of the present disclosure.

FIG. 1B is a cross-sectional view schematically illustrating a memory cell 100 in the memory array 10, according to some embodiments of the present disclosure.

Referring to FIG. 1A and FIG. 1B, each memory cell 100 may include a selector 110 and a resistance variable storage element 120. The selector 110 is a two-terminal switching device, and one of the terminals of the selector 110 is shared with the resistance variable storage element 120. In some embodiments, an electrode 112 is functioned as a bottom terminal of the selector 110, and may be coupled to the first signal line SL1 directly. In some embodiments, the electrode 112 may be coupled to the first signal line SL1 through a conductive via (not shown). In addition, an electrode 114 may be functioned as a top terminal of the selector 110, and may be shared with the resistance variable storage element 120. The electrodes 112, 114 are each formed of a conductive material. As examples, candidates of the conductive material may include Cu, W, TiN, TaN, Ru, Co, C, the like and combinations thereof.

A switching layer 116 may be sandwiched between the electrodes 112, 114. An electrical resistance across the switching layer 116 may be altered during operation of the selector 110. When the switching layer 116 is in a low resistance state, the selector 110 is referred as being turned on, and the resistance variable storage element 120 becomes accessible. On the other hand, when the switching layer 116 is in a high resistance state, the selector 110 is described as in an off state, and the resistance variable storage element 120 is inaccessible. In some embodiments, the selector 110 is an ovonic threshold switch (OTS) selector. In these embodiments, when a voltage bias applied across the switching layer 116 reaches a threshold voltage, a conductive path may be formed through the switching layer 116, and the switching layer 116 is in the low resistance state. On the other hand, when the voltage bias does not reach the threshold voltage or falls below a holding voltage from above the threshold voltage, the conductive path may not continuously extend through the switching layer 116, and the switching layer 116 is in the high resistance state. As will be further described, the switching layer 116 includes a chalcogenide compound. In some embodiment, the chalcogenide compound comprising germanium, carbon and tellurium. For example, the chalcogenide compound includes NGeCTe, SiNGeCTe, or the like, which is not limited thereto. In some embodiments, the thickness $t_s$ of the switching layer 116 is equal to or less than 5 nm, which will be further described.

The resistance variable storage element 120 may be a two-terminal device as well. As described above, the electrode 114 may be functioned as a common terminal of the selector 110 and the resistance variable storage element 120. In some embodiments, an electrode 122 is functioned as the other terminal of the resistance variable storage element 120, and may be coupled to the second signal line SL2. As similar to the electrodes 112, 114, the electrode 122 is formed of a conductive material as well. As examples, candidates of the conductive material may include Cu, W, TiN, TaN, Ru, Co, C, the like and combinations thereof.

A storage layer 124 lies between the two terminals of the resistance variable storage element 120 (e.g., the electrodes 114, 122). Microstructure in the storage layer 124 may be altered according to input signals applied across the storage layer 124. In corresponding to the microstructure change, the storage layer 124 may be switched between a high resistance state and a low resistance state. Further, the resistance state of the storage layer 124 may be held even when the input signal is removed, and the resistance variable storage element 120 may be referred as a non-volatile memory device. In some embodiments, the memory array 10 is a phase change random access memory (PCRAM). In these embodiments, a crystallinity of the storage layer 124 may be increased when the storage layer 124 is turned to the low resistance state. On the other hand, when the storage layer 124 is in the high resistance state, the storage layer 124 may be amorphous or may have a rather low crystallinity. In some embodiments, the storage layer 124 is formed of a chalcogenide compound. The chalcogenide compound may include Ge, Te and Sb. For instance, the chalcogenide material may be GeSbTe, such as $Ge_2Sb_2Te_5$ (GST225), $Ge_4Sb_2Te_4$ (GST424), $Ge_4Sb_6Te_7$ (GST467) or so forth. As other examples, the chalcogenide may include $Ti_{0.4}Sb_2Te_3$, superlattice $Sb_2Te_3/TiTe_2$, superlattice $GeTe/Sb_2Te_3$, superlattice $Ti_2Te/Sb_2Te_3$ or so forth). In alternative embodiments, the memory array 10 is a resistive random access memory (RRAM), and the storage layer 124 is a dielectric layer, such as a high-k dielectric layer. In these alternative embodiments, a conductive filament may be formed through the storage layer 124 when the storage layer 124 is at the low resistance, while such conductive filament may be cut off when the storage layer 124 is switched to the high resistance state. In other embodiments, the memory array 10 is a magnetoresistive random access memory (MRAM), and the storage layer 124 may be a magnetic tunneling junction (MTJ) that includes at least two magnetic layers and an insulating barrier layer extending between the magnetic layers.

In some embodiments, the sidewall of the electrode 122 is substantially coplanar with the sidewalls of the storage layer 124, the electrodes 114, 112 and the switching layer 116. In alternative embodiments (not shown), the electrode 122 has a footprint area smaller than a footprint area of each of the storage layer 124, the electrodes 114, 112 and the switching layer 116. In these alternative embodiments, a sidewall of the electrode 122 may be laterally recessed from sidewalls of the storage layer 124, the electrodes 114, 112 and the switching layer 116.

According to some embodiments, a liner 126 is formed along the side walls of the electrodes 112, 114, the switching layer 116, the storage layer 124 and the electrode 122, and may further cover the top surface of the first electrode SL1. The liner 126 is formed as spacers when the etching of the memory cell 100 is done. In some embodiments, a material of the liner 126 includes SiN.

Figure 1C:
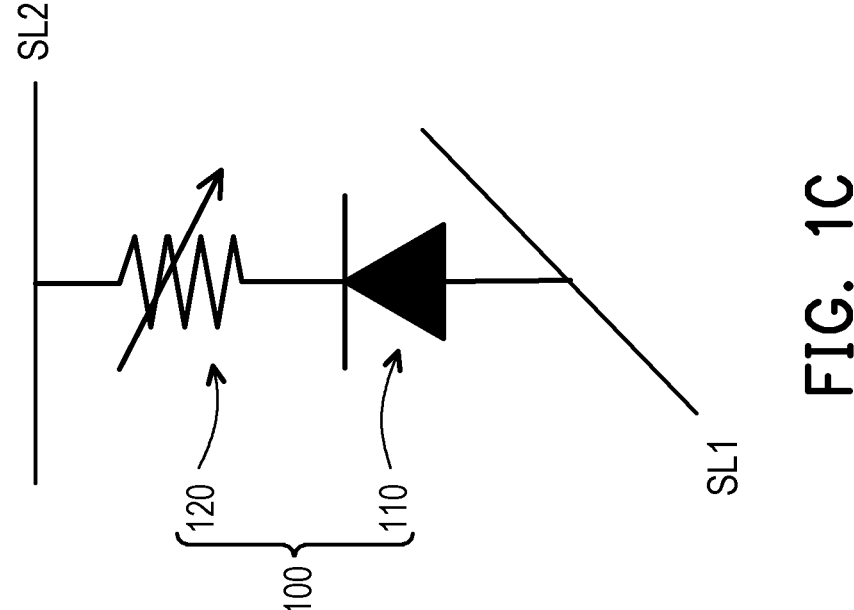
FIG. 1C is an equivalent circuit of a memory cell, according to some embodiments of the present disclosure.

FIG. 1C is an equivalent circuit of a memory cell 100, according to some embodiments of the present disclosure.

Referring to FIG. 1B and FIG. 1C, the selector 110 is schematically indicated by a diode in the equivalent circuit, as a diode is also a two-terminal switching device. However, the selector 110 may be bi-directional, and may be actually presented by two diodes connected back to back. In addition, the resistance variable storage element 120 is indicated by a variable resistor in the equivalent circuit, as a variable resistor also has an alterable resistance. As shown in FIG.

1C, the selector 110 and the resistance variable storage element 120 are serially connected between a first signal line SL1 and a second signal line SL2, and share a common terminal. Since the selector 110 and the resistance variable storage element 120 are connected in series, a voltage applied across the memory cell 100 is divided across the selector 110 and the resistance variable storage element 120.

During operation of the memory cell 100, a voltage pulse may be provided to one of the corresponding first and second signal lines SL1, SL2, and the other one of these first and second signal lines SL1, SL2 may receive a reference voltage (e.g., a ground voltage). In order to program the resistance variable storage element 120, the voltage pulse must reach a voltage high enough for ensuring that a voltage across the selector 110 is greater than the threshold voltage of the selector 110, such that the selector 110 can be turned on. Accordingly, the resistance variable storage element 120 is accessible, and can be programmed. On the other hand, in some embodiments, the voltage pulse may be provided with a lower peak voltage during a read operation, such that the selector 110 can be turned on when a low resistance state is stored in the resistance variable storage element 120, and may be in an off state when a high resistance state is stored in the resistance variable storage element 120. In these embodiments, by detecting whether a conductive path is established through the selector 110 and the resistance variable storage element 120, the resistance state stored in the resistance variable storage element 120 can be identified. In alternative embodiments, the selector 110 is turned on even during a read operation for sensing a high resistance state stored in the resistance variable storage element 120.

Figure 1D:
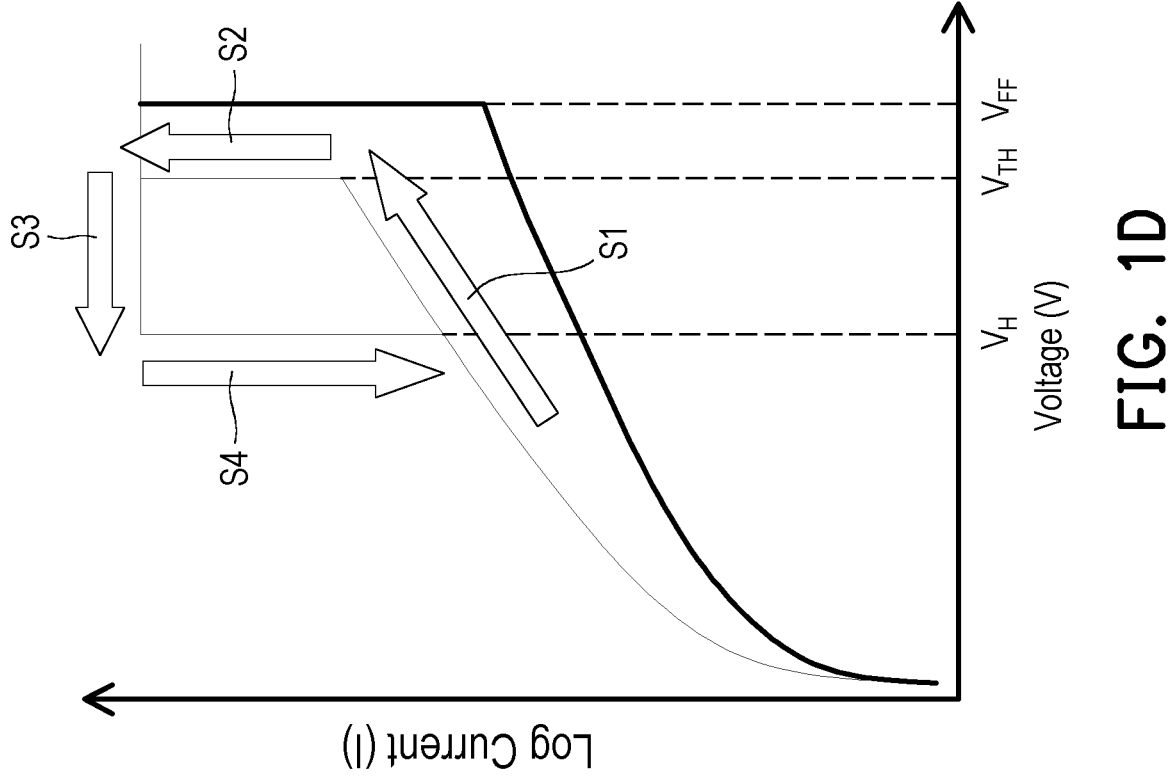
FIG. 1D is a current-voltage (I-V) curve illustrating an operation cycle of a selector, according to some embodiments of the present disclosure.

FIG. 1D is a current-voltage (I-V) curve illustrating an operation cycle of a selector 110, according to some embodiments of the present disclosure.

Referring to FIG. 1D, each operation cycle of the selector 110 may have multiple stages. Along a timeline, a voltage applied across the selector 110 may increase during a first stage S1, and then decrease at a third stage S3. At the first stage S1, a current passing through the selector 110 stays low, and the selector 110 is in a high resistance state (i.e., an off state). When the voltage is raised over a threshold voltage $V_{TH}$ of the selector 110, operation of the selector 110 enters a second stage S2. At the second stage S2, the current passing through the selector 110 significantly increases as the voltage across the selector 110 is slightly raised or kept at the threshold voltage $V_{TH}$, and the selector 110 is being switched to a low resistance state (i.e., an on state). When the current is saturate, operation of the selector 110 enters the third stage S3, at which the current passing through the selector 110 remains high, and the selector 110 is in the low resistance state (i.e., the on state). A fourth stage S4 is entered as the voltage across the selector 110 is lowered below a holding voltage $V_H$, and the current passing through the selector 110 decreases dramatically as the voltage applied across the selector 110 is slightly lowered. At the fourth stage S4, the selector 110 is being switched back to the high resistance state (i.e., the off state), and an operation cycle may be completed.

When the selector 110 is turned on at the third stage S3, the resistance variable storage element 120 coupled to the selector 110 can be programmed, or a read current may pass through the resistance variable storage element 120 and the selector 110. On the other hand, the selector 110 returns to the first stage S1 when a programming operation of the resistance variable storage element 120 or detection of the read current is over. In addition, the selector 110 may stay at the first stage S1 while not being selected, or in a condition that the resistance variable storage element 120 at a high resistance state is subjected to a read operation.

Prior to the operation cycles respectively described above, a conductive path may be initially formed across the switching layer 116 of the selector 110 when the voltage applied to the switching layer 116 reaches a first fire voltage $V_{FF}$. After the initially formed conductive path is cut off by pulling down the voltage applied across the selector 110 to the holding voltage $V_H$ from the first fire voltage, the operation cycles respectively described above can be performed. During each of these operation cycles, the conductive path may be reconstructed and then cut off. The first fire voltage may be greater than the threshold voltage $V_{TH}$, which is higher than the holding voltage $V_H$.

Figure 2:
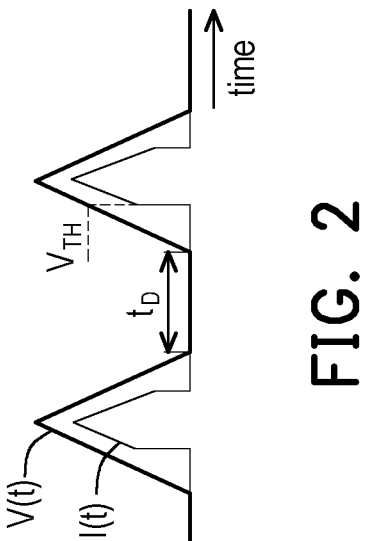
FIG. 2 illustrates the relationship of the voltage and current of a selector as a function of time.

FIG. 2 illustrates the relationship of voltage V(t) and current I(t) of a selector as a function of time.

As shown in FIG. 2, a series of triangular voltage pulse are applied to a selector similar to the selector 110 shown in FIG. 1B. The two triangular voltage pulses are separated by a delay time $t_D$. The current I(t) passing through the selector 110 starts to increase when the voltage V(t) reach the threshold voltage $V_{TH}$. However, the threshold voltage $V_{TH}$ of the selector increases, or drifts, as a function of the delay time $t_D$ between the voltage pulses. In other words, the threshold voltage $V_{TH}$ for the voltage pulse is different and slightly higher than the average threshold voltage $V_{TH,0}$. Typically, the following empirical equation is used to describe the drift trend of the threshold voltage $V_{TH}$ of the selector when the delay time is $t_D$: $V_{TH} = V_{TH,0} + \eta \cdot \log_{10}(t_D/t_0)$, wherein $t_0$ is a standard delay time, such as 1 second, $V_{TH,0}$ is an average threshold voltage when delay time is $t_0$, and $\eta$ is the drift slope.

In an ideal scenario, the drift slope $\eta$ is 0, which means the threshold voltage $V_{TH}$ does not vary with time. However, since the drift slope $\eta$ is larger than zero, the threshold voltage $V_{TH}$ increases with the delay time $t_D$. According to this equation, the threshold voltage $V_{TH}$ logarithmically increases with the delay time $t_D$. In other word, the threshold voltage $V_{TH}$ is sensitive to the frequency of operation, or the delay time $t_D$ between the two voltage pulses. If the two voltages pulses are arrived at a very short time period with a small delay time $t_D$, where $t_D < t_0$, the variation of the threshold voltage $V_{TH}$ is small, which is the difference between the threshold voltages of the voltage pulse and the average threshold voltage $V_{TH,0}$ is small. If the two voltage pulses are separated by a long period of time with a large delay time $t_D$, where $t_D < t_0$, the variation of the threshold voltage $V_{TH}$ is large, which is the difference between the threshold voltages of the voltage pulse and the average threshold voltage $V_{TH,0}$ is large. In order to reduce the threshold voltage variation, it is important to minimize the drift slope $\eta$ for the selector.

Figure 3:
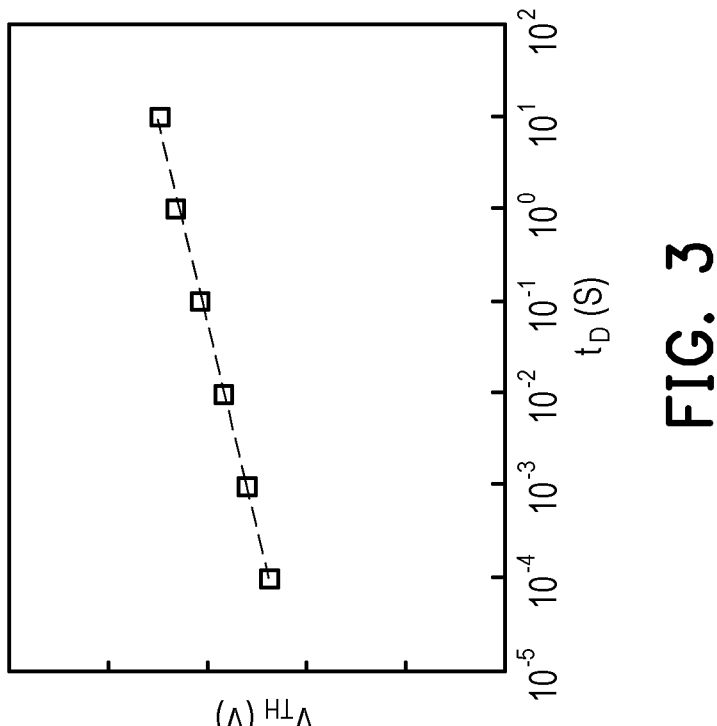
FIG. 3 illustrates the threshold voltage of the selector as a function of delay time.

FIG. 3 illustrates the threshold voltage $V_{TH}$ of the selector as a function of delay time $t_D$. In a typical OTS selector, the selector is made of chalcogenide material with a thickness about 30 nm. The horizontal axis, the delay time $t_D$, is shown in logarithmic scale. As shown in FIG. 3, the threshold voltage $V_{TH}$ increases with the delay time $t_D$, following the trend $V_{TH} = V_{TH,0} + \eta \cdot \log_{10}(t_D/t_0)$.

As shown in FIG. 3, the time scale of the delay time $t_D$ crosses several orders of magnitude, ranging from $10^{-5}$ s to $10^2$ s. During a normal read/write process of a memory device, the delay time $t_D$ of the read/write voltage pulse across the selector of the memory cell is around $10^{-3}$ second to fulfill the fast readout requirement of the memory device. When the memory device is not in use, such as the system is off, the delay time $t_D$ between the two pulses may be minutes or hours or even days. In this situation, the delay time $t_D$ can be at the order of $10^2$ second. In some scenarios, the delay time $t_D$ can be as long as several days or months.

Please refer back to FIG. 1B. In a typical OTS selector, or a bulk-like selector, a thickness of the chalcogenide switching layer is typically ranging from about 10 nm to about 30 nm, or even larger. With the thickness of the switching layer ranging from about 10 nm to about 30 nm, the threshold voltage $V_{TH}$ of the switching layer is large, and the drift slope $\eta$ is also large.

In order to reduce the threshold voltage $V_{TH}$ and the drift slope $\eta$, the switching layer 116 of the selector 110 is designed with a smaller thickness. In some embodiments, a thickness $t_s$ of the switching layer 116 is ranging from about 1 nm to about 5 nm. With the thickness $t_s$ of the switching layer 116 being about 5 nm or less, the drift slope $\eta$ of the switching layer 116 is reduced compared to a thicker switching layer, such as a switching layer with the thickness at 10 to 30 nm.

Figure 4B:
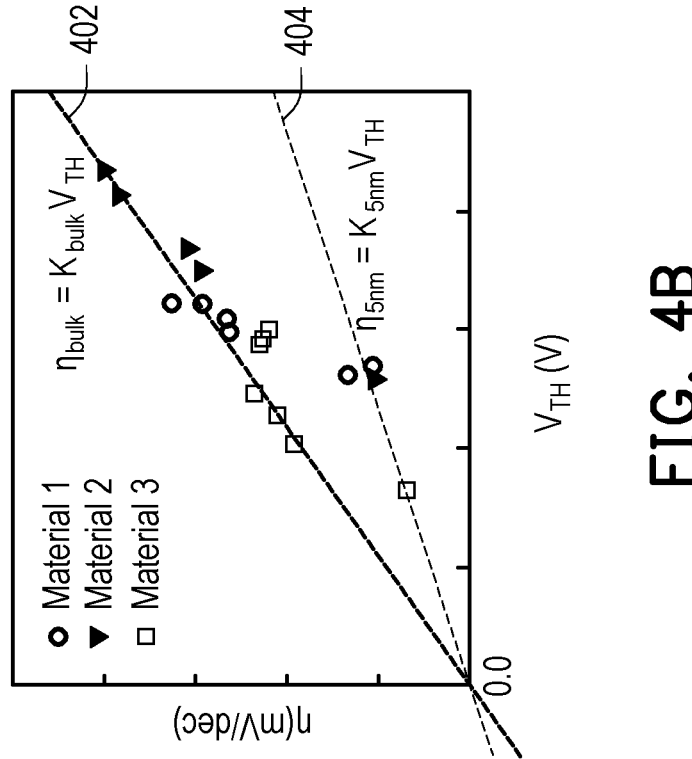
FIG. 4B illustrates the drift slope $\eta$ of switching layers of different chalcogenide materials as a function of threshold voltage of the switching layers.
Figure 4A:
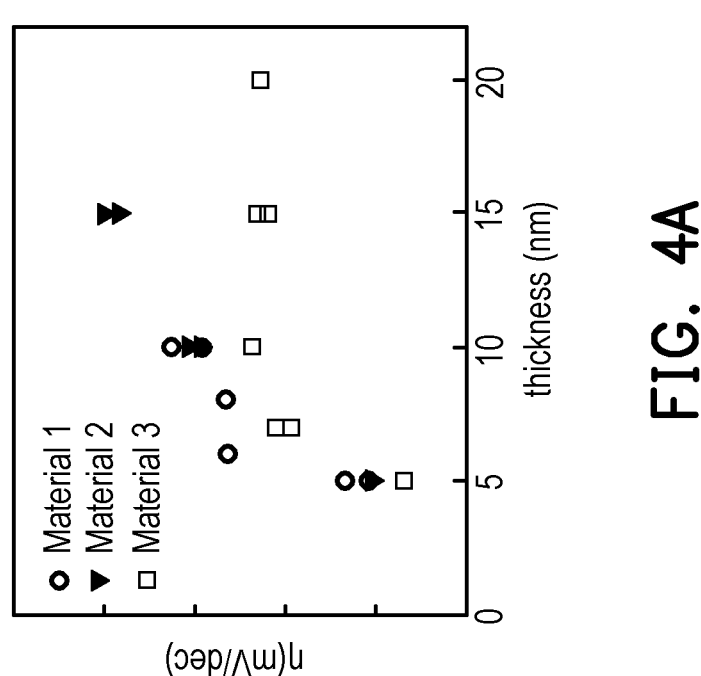
FIG. 4A illustrates the drift slope of switching layers of different chalcogenide materials as a function of the switching layer thicknesses.

FIG. 4A illustrates the drift slopes of switching layers of different chalcogenide materials as a function of the switching layer thicknesses. The drift slopes $\eta$ of three different chalcogenide materials are plotted. For material 1 and material 2, the drift slopes $\eta$ of the material 1 and material 2 decrease with the thicknesses starting from the thickness at about 15 nm. The decreasing of the drift slopes $\eta$ roughly follow a linear trend. When the thicknesses of the material 1 and material 2 decrease to about 5 nm, the drift slopes $\eta$ of material 1 and material 2 drop significantly and are not following the linear trend at the thicknesses larger than about 5 nm. The drift slopes $\eta$ of material 1 and material 2 at about 5 nm are much lower than the linear trend predicts. Thus, when the thickness of the switching layer is reduced to be equal to or less than 5 nm, the drift slope $\eta$ of the switching layer is much smaller than the drift slope $\eta$ of the switching layer with a larger thickness. For material 3, the drift slope $\eta$ is roughly unchanged between the thickness between 8 and 20 nm. However, when the thickness decreases to 5 nm, the drift slope $\eta$ of material 3 drops roughly by half. As a result, as shown in materials 1, 2 and 3, when the thickness of the switching layer is large, for example, larger than 10 nm, the drift slope $\eta$ approximately varies linearly with the thickness of the switching layer. When the thickness of the switching layer is reduced to be equal to or less than 5 nm, the drift slope $\eta$ decreases faster than the trend of the drift slope at larger thickness values predicts. In some embodiments, the drift slope $\eta$ for the switching layer with thickness equal to or less than 5 nm is between 10 and 30 mV/dec. In some embodiments, the drift slope $\eta$ for the switching layer with thickness equal to or less than 5 nm is between 14 and 27 mV/dec.

FIG. 4B illustrates the drift slope $\eta$ of switching layers of different chalcogenide materials as a function of threshold voltage of the switching layers. The drift slopes $\eta$ of three different kinds of chalcogenide materials are plotted as a function of the threshold voltage $V_{TH}$ at the delay time at 1 second. There are two groups of data points on the plot. The first group of data points are switching layers with thicknesses between about 10 nm to about 30 nm, which are referred as "bulk". The trend of the first group of data is referred as line 402. As shown in FIG. 4B, for the bulk-like switching layers, the drift slopes $\eta$ of all three materials follow the line 402 as a function of threshold voltage $V_{TH}$, which is expressed as $\eta_{bulk}=k_{bulk}\cdot V_{TH}$, wherein $k_{bulk}$ is the slope of line 402. The second group of data points are switching layers with thicknesses at about 5 nm of all three materials. The trend of the second group of data is referred as line 404. As shown in FIG. 4B, for these thinner switching layers, the drift slope $\eta$ of all three materials follows the line 404 as a function of threshold voltage $V_{TH}$, which is expressed as $\eta_{5nm}=k_{5nm}\cdot V_{TH}$, wherein $k_{5nm}$ is the slope of line 404.

As shown in FIG. 4B, for the two kinds of thickness, bulk-like or at about 5 nm, the drift slopes $\eta$ are both proportional to the threshold voltage $V_{TH}$, with a proportionality constant $k_{bulk}$ and a zero intercept at the vertical direction. For the switching layers with larger thicknesses, the switching layers have larger proportionality constant k. As a result, for the same threshold voltage, a thinner switching layer has a smaller drift slope $\eta$ than a thicker switching layer. With smaller drift slope $\eta$, the threshold voltage $V_{TH}$ of the thinner switching layer is more stable and has less variation than the threshold voltage $V_{TH}$ of the thicker switching layer.

Figures 4C, 4D:
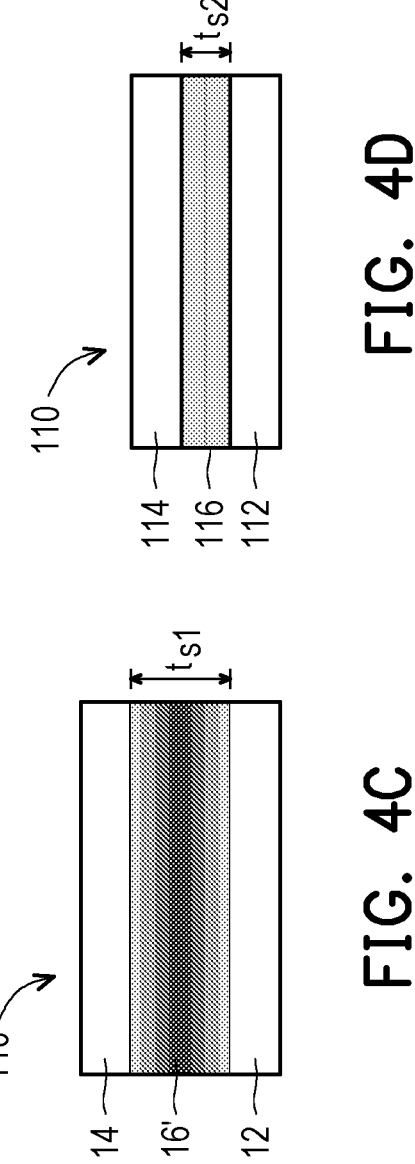
FIG. 4C illustrates the structural relaxation of a bulk-like switching layer.
FIG. 4D illustrates the structural relaxation of a thin switching layer.

FIG. 4C illustrate the structural relaxation of a bulk-like switching layer. FIG. 4D illustrates the structural relaxation of a thin switching layer. Please refer to FIG. 4C and FIG. 4D. One of the possible explanations of the drift slope $\eta$ varies with the thickness of the switching layer is due to difference in the structural relaxation of the switching layer. The more the structural relaxation in the switching layer, the larger the drift slope $\eta$, since the relaxation in the switching layer will change the threshold voltage of the switching layer, and cause the increase of drift slope $\eta$. For a chalcogenide material switching layer sandwiched by two electrodes, the structural relaxation distribution is different at the interface region between the switching layer and the electrode and the bulk region, which is away from the interface region. At the interface region, which is between the switching layer and the electrode, the switching layer has the least structural relaxation, which is more stable. The structural relaxation of the switching layer is larger at the bulk region, which is less stable than the interface region. Thus, the thicker the switching layer, the more structural relaxation at the bulk region, or the center region, of the switching layer.

In FIG. 4C and FIG. 4D, the color density of the switching layer sandwiched by the two electrodes represents the density of the structural relaxation of the switching layer, wherein the darker the color, the higher the density of the structural relaxation, and the lighter the color, the lower the density of the structural relaxation.

For example, in FIG. 4C, in the selector 110', the switching layer 116' with thickness $t_{s1}$, which is sandwiched by two electrodes 112 and 114, has less structural relaxation at the interface regions between switching layer 116' and the electrodes 112 and 114, which is represented by lighter color. The switching layer 116' has more structural relaxation at the bulk region, or at the center of the switching layer 116', which is represented by darker color, since the thickness $t_{s1}$ of the switching layer 116' is large. With more structural relaxation in the switching layer 116', the switching layer has a larger drift slope as shown in line 402 of FIG. 4B.

On the other hand, in FIG. 4D, for the selector 110, the thickness $t_{s2}$ of the switching layer 116 is thinner than the thickness $t_{s1}$ of the switching layer 116' of the selector 110 in FIG. 4C. As shown in FIG. 4D, the switching layer 116 has less structural relaxation at the interface regions between the switching layer 116 and the electrodes 112 and 114. However, since the switching layer 116 in FIG. 4D is thinner than the switching layer 116' in FIG. 4C, there is almost no bulk region contribution of the structural relaxation. Thus, the overall structural relaxation in the thinner switching layer 116 in FIG. 4D is less than the overall structural relaxation in the thicker switching layer 116' in FIG. 4C. The thinner switching layer 116 in FIG. 4D has a smaller drift slope η, as shown in line 404 of FIG. 4B.

Figure 5A:
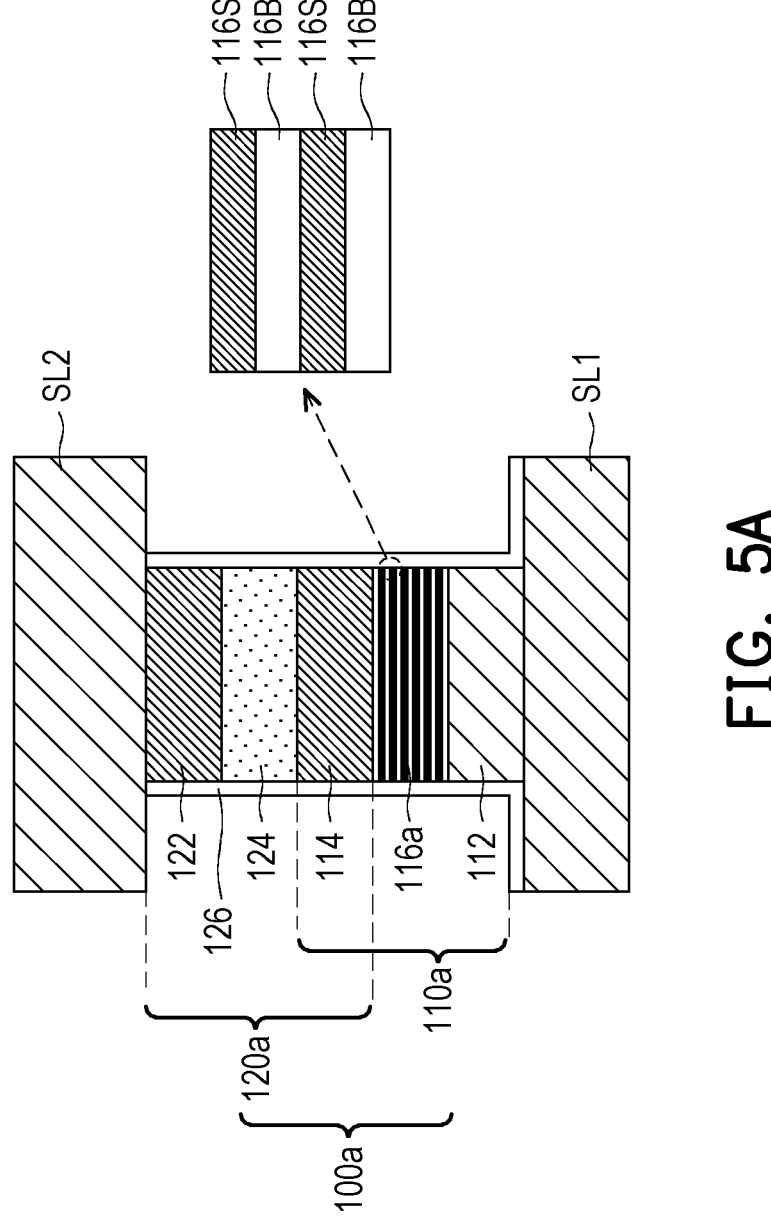
FIG. 5A is a cross-sectional view schematically illustrating a memory cell in a memory array, according to some embodiments of the present disclosure.

FIG. 5A is a cross-sectional view schematically illustrating a memory cell in a memory array, according to some embodiments of the present disclosure. The memory cell 100*a* is similar to the memory cell 100 shown in FIG. 1B, comprising a resistance variable storage element 120*a* including electrodes 114, 122 and a storage layer 124. The difference is that the switching layer 116 of the selector 110 in FIG. 1B is replaced with a multi-layer switching layer 116*a* of the selector 110*a*, which is a two-terminal selector. The multi-layer switching layer 116*a* includes alternately stacked switching layer(s) 116S and buffer layer(s) 116B.

In this embodiment, a thickness $t_s$ of each of the switching layer(s) 116S is about 1 nm to about 5 nm. In some embodiments, a thickness $t_s$ of each of the switching layer(s) 116S is about 1 nm to about 2 nm. With the thickness $t_s$ of the switching layer at about 5 nm or less, the drift slope η of each of the switching layers 116S is much smaller than the drift slope η of the switching layers with larger thickness, such as larger than 10 nm. The materials of the switching layer(s) 116S includes a chalcogenide material. In this embodiment, the chalcogenide material includes NGeCTe, SiNGeCTe, or the like. In this embodiment, the number of switching layers 116S is between 1 to 15, however, the number of the switching layers 116S is not limited thereto.

As shown in FIG. 5A, the buffer layers 116B are alternating with the switching layers 116S. The buffer layers 116B are arranged to separate the switching layers 116S so the switching layers 116S do not interact with each other, since if the individual switching layers 116S are too close to the nearby switching layers, the switching layers 116S may behave like a bulk, instead of multiple thin switching layers stacked together. In this embodiment, a thickness $t_B$ of each of the buffer layers 116B is ranging from about 1 nm to about 5 nm, which is compatible with the thickness $t_S$ of the switching layers 116S. If the thickness $t_B$ of the buffer layers 116B is much larger than the thickness $t_S$ of the switching layers 116S, then current may not be able to flow through the buffer layers 116B to the switching layers 116S to let the current passes through the selector 110*a*. In this embodiment, a material of the buffer layers 116B includes a metallic material or a semiconductor, which is not limited thereto. In some embodiments, the material of the buffer layers 116B includes W, C, Si, SiC, WTe, CTe, SbTe, TiTe, or the like. In this embodiment, the number of buffer layers 116B is between 1 to 15, which is the same as the number of switching layers 116S, however, the number is not limited thereto. The total number of layers of the switching layers 116S and the buffer layers 116B depends on the desired properties of the memory device, such as the threshold voltage, drift slope of the memory device.

The multi-layer switching layer 116*a* of the memory cell 100*a* as shown in FIG. 5A has the following advantages. Since each switching layer 116S are thin with the thickness at about 5 nm or less, each switching layer 116S has a small drift slope η. By stacking thin layers of switching layers 116S, the drift slope η of the multi-layer switching layer 116*a* is also small. Thus, compare to a bulk-like switching layer with a thickness equal to the total thickness of the switching layers in the multi-layer switching layer 116*a*, the multi-layer switching layer structure has a smaller drift slope η compared to the bulk-like switching layer.

Furthermore, compared to a single-layer switching layer, such as the switching layer 116 of the memory cell 100 in FIG. 1B, by stacking more layers, the total thickness of the switching layers increases. With a larger total thickness of the switching layers, the multi-layer switching layer 116*a* has a lower leakage current $I_{OFF}$ than the leakage current in a single-layer switching layer, which improves the performance of the memory cell 100*a*.

Furthermore, through the layer engineering of the multi-layer switching layer 116*a*, such as adjusting the number of layers and the thickness of the switching layers, the threshold voltage $V_{TH}$ of the multi-layer switching layer 116*a* can be tuned to desired values.

For a typical selector, each of the switching layers 116S has a high resistance state and a low resistance state. In some embodiments, the high resistance state of the switching layer 116S is referred as the off-state of the selector, and the low resistance state of the switching layer 116S is referred as the on-state of the selector. In some embodiments, the high resistance state of the switching layer 116S is referred as the on-state of the selector, and the low resistance state of the switching layer 116S is referred as the off-state of the selector.

In some embodiments, the resistance of the buffer layer 116B is comparable or less than the resistance of the higher-resistance state of the switching layer 116S, so the voltage drop happens mostly at the switching layer 116S. In some embodiments, the resistance of the buffer layer 116B is larger than the resistance of the low resistance state of the switching layer 116S. In some embodiments, the resistance of the buffer layer 116B is larger than the resistance of the low resistance state of the switching layer 116*s* by less than 10% of the resistance of the low resistance state of the switching layer 116S. Thus, when the selector is in low resistance state, the slightly larger resistance in the buffer layer 116B can mitigate the current spread in the switching layers 116S.

To make the resistance of the buffer layer 116B lower than the resistance of off-state of the switching layer 116S, the buffer layer 116B may be conductive or semi-conductive. In some embodiments, the material of the buffer layer 116S includes a metallic material, or a semiconductor material.

In some embodiments, the buffer layers 116B are each formed of a resistance variable material, and configured to be switched between a high resistance state and a low resistance state. In some embodiments, the resistance variable material includes CTe. In some embodiments, the resistance variable material is also referred as weak switching material, compared to the material of the switching layer 116S.

Figure 5B:
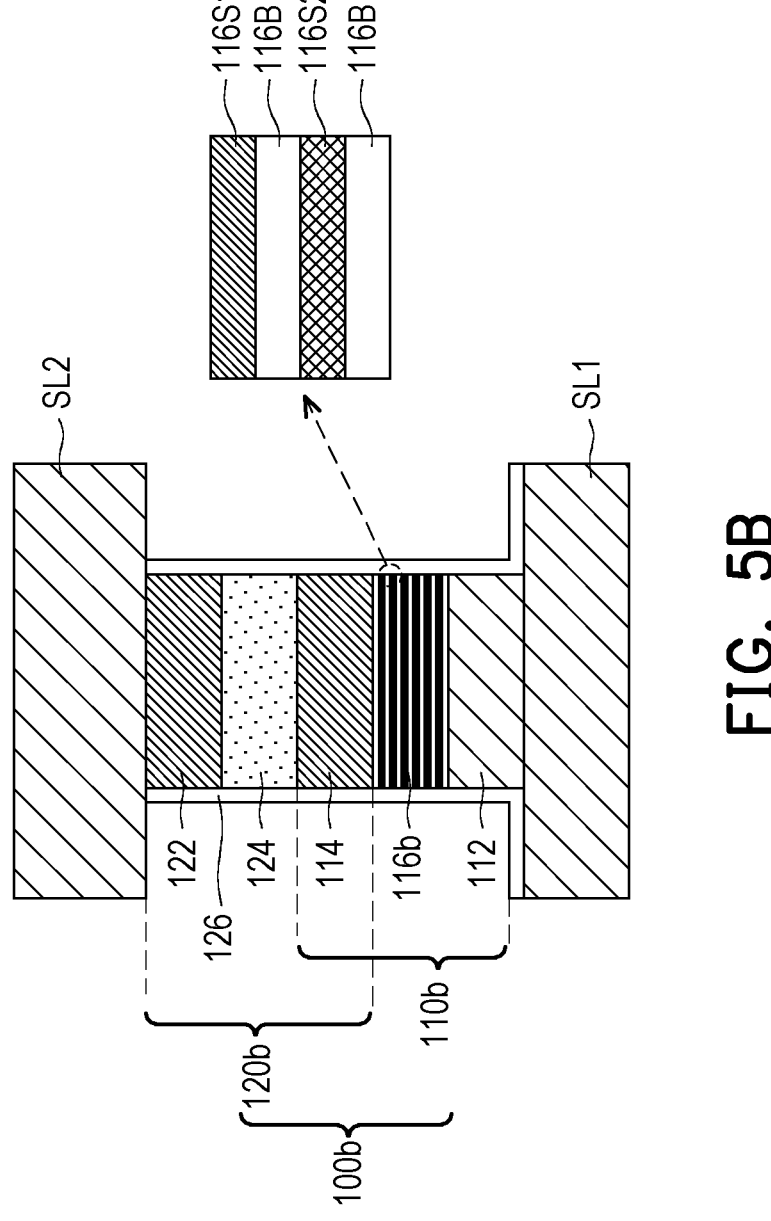
FIG. 5B is a cross-sectional view schematically illustrating a memory cell in a memory array, according to some embodiments of the present disclosure.

FIG. 5B is a cross-sectional view schematically illustrating a memory cell in a memory array, according to some embodiments of the present disclosure. The memory cell 100*b* is similar to the memory cell 100*a* shown in FIG. 5A, comprising a resistance variable storage element 120*b* including electrodes 114, 122 and a storage layer 124. The difference is that comparing to the multi-layer switching layer 116*a* of the selector 110*a* in FIG. 5A, the multi-layer switching layer 116B of the selector 110*b* has two different switching layers 116S1 and 116S2. The switching layers 116S1 and 116S2 are alternating with each other, and are separated by buffer layers 116B. In this embodiment, the materials of the switching layers 116S1 and 116S2 are different. With two different switching layers alternating with each other, the properties of multi-layer switching layer 116B, such as the drift slope η, the threshold voltage $V_{TH}$, can be engineered to achieve the desired properties. In some other embodiments, the two different kinds of switching layers 116S1 and 116S2 are not alternatingly arranged. For example, for the layers near the interface between the electrodes, the switching layers may be formed by a first kind of switching material, and for layers at the center of the multi-layer switching layer 116B, the switching layers may be formed by a second kind of switching material, wherein the resistance of the second material (an on-state (low resistance state) resistance of the second material) is larger than the resistance of the first material (an on-state resistance of the first material). In other words, the multi-layer switching layer 116B has a smaller resistance at both ends and a larger resistance at the center.

Figure 6:
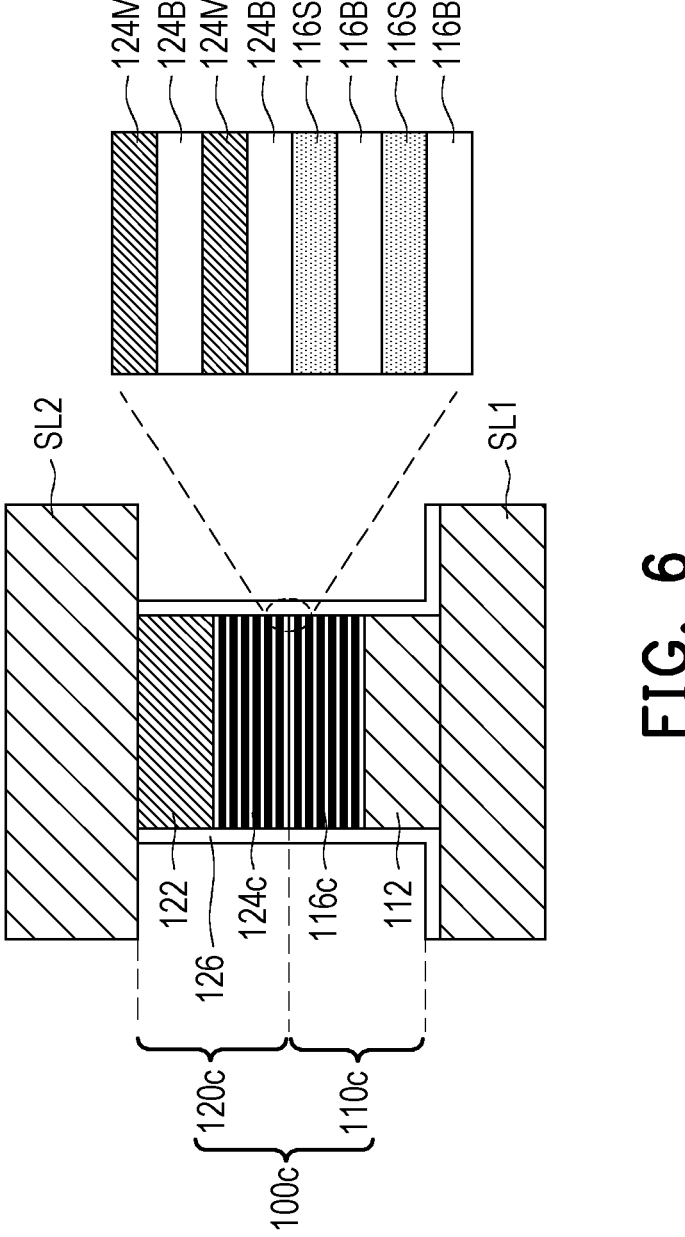
FIG. 6 is a cross-sectional view schematically illustrating a memory cell in a memory array, according to some embodiments of the present disclosure.

FIG. 6 is a cross-sectional view schematically illustrating a memory cell in a memory array, according to some embodiments of the present disclosure. The memory cell 100c is similar to the memory cell 100a shown in FIG. 5A. The difference is that the resistance variable storage device 120c is a superlattice phase change memory.

As shown in FIG. 6, the resistance variable storage device 120c is coupled directly to the multi-layer switching layer 116c, without an intermediate electrode, such as the electrode 114 shown in FIG. 1B, FIG. 5A and FIG. 5B. Without the intermediate electrode 114, the current confinement in the memory layers 116M is improved due to the switching layer 116S localized on-state.

In general, by using a superlattice phase change memory, the resistance variable storage device 120c has a relatively low resistance drift. Together with the multi-layer switching layer 116c, which has a relatively low threshold voltage drift, the memory cell 100c has the advantage of low resistance and low threshold voltage drift, compare to a typical memory cell.

In some embodiments, the material of the buffer layers 116B of the multi-layer switching layer 116c and the material the buffer layers 120B of the super-lattice resistance variable storage device 120c are the same. In some embodiments, the material of the buffer layers 116B and 124B can be SbTe, TiTe, or the like. Thus, the production process of the memory cells 100c can be simplified.

Figure 7:
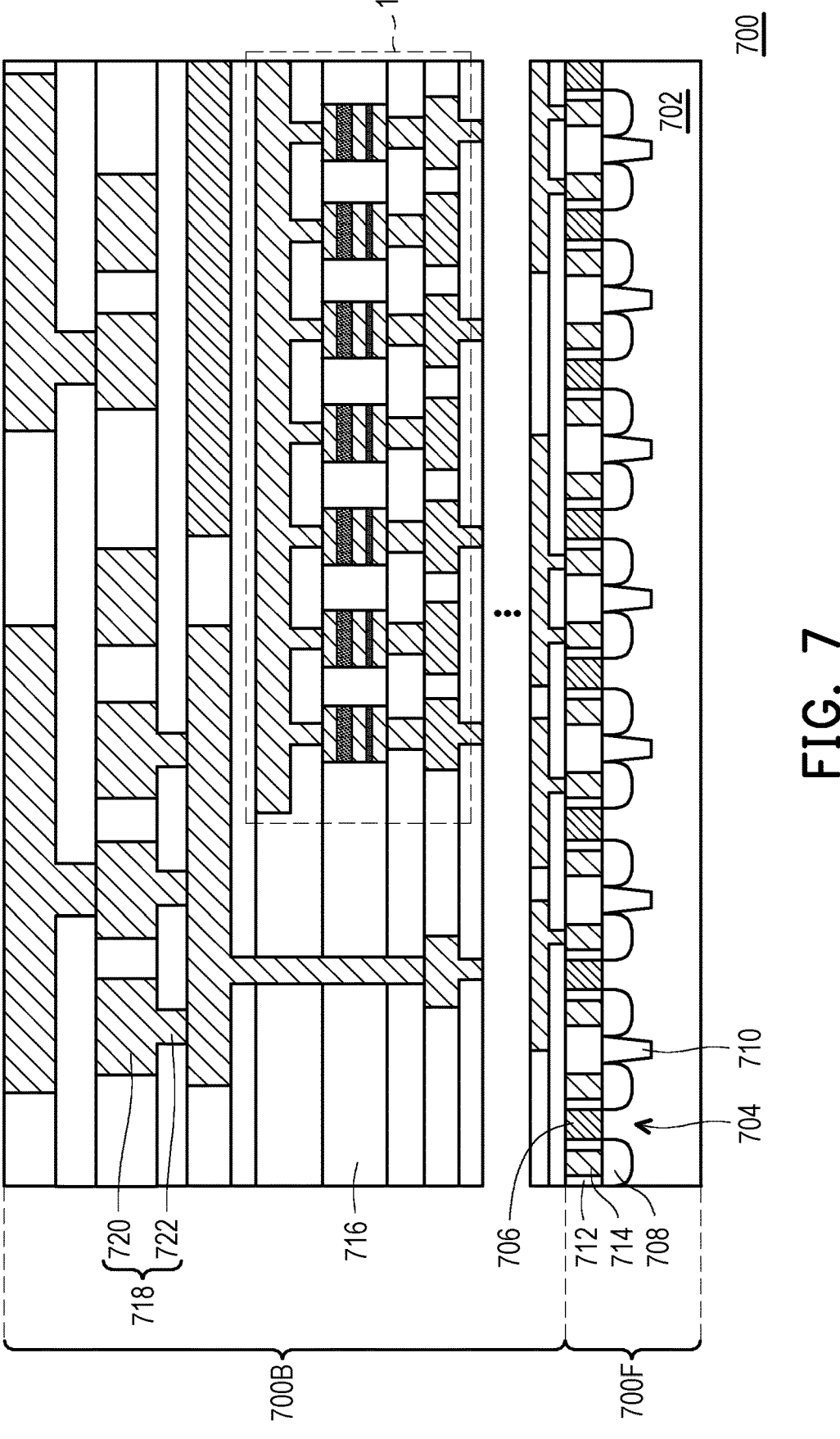
FIG. 7 is a schematic cross-sectional view illustrating a semiconductor chip with a memory array embedded therein, according to some embodiments of the present disclosure.

FIG. 7 is a schematic cross-sectional view illustrating a semiconductor chip 700 with the memory array 10 (shown in FIG. 1A) embedded therein, according to some embodiments of the present disclosure. In some embodiments, the memory array 10 may include memory cells 100, 100a, 100b or 100c.

Referring to FIG. 7, the semiconductor chip 700 may have a front-end-of-line (FEOL) structure 700F built on a semiconductor substrate 702. The FEOL structure 700F may include transistors 704. Each of the transistors 704 may include a gate structure 706 and a pair of source/drain structures 708 at opposite sides of the gate structure 706. Further, adjacent transistors 704 may be isolated from one another by an isolation structure 710 formed in the semiconductor substrate 702. In some embodiments, the transistors 704 are planar type transistors. In these embodiments, the gate structures 706 are formed on planar portions of the semiconductor substrate 702, and the source/drain structures 708 may be formed in the semiconductor substrate 702. In alternative embodiments, the transistors 704 are fin type transistors or gate-all-around (GAA) transistors. In these alternative embodiments, the semiconductor substrate 702 may be shaped to form fin structures at its top surface, or stacks of channel structures (e.g., stacks of semiconductor nanosheets) may be formed on the semiconductor substrate 702. Each fin structure/channel structure may extend between a pair of the source/drain structures 708. In addition, the gate structures 706 may intersect and cover the fine structures or the stacks of channel structures. Moreover, the FEOL structure 700F may further include a dielectric layer

712 and contact structures 714 formed in the dielectric layer 712. The contact structures 714 penetrate through the dielectric layer 712, to establish electrical contact with the source/drain structures 708.

The memory array 10 may be embedded in a back-end-of-line (BEOL) structure 700B formed on the FEOL structure 700F. The BEOL structure 60B may include a stack of interlayer dielectric layers 716. For conciseness, only one of the interlayer dielectric layers 716 is labeled. The memory array 10 is formed in successive ones of the interlayer dielectric layers 716. Further, the BEOL structure 700B also includes conductive elements 718 spreading in the stack of interlayer dielectric layers 716, for interconnecting the transistors 704, and for out-routing the memory array 10. The conductive elements 718 may be distributed below, around and over the memory array 10, and may include conductive patterns 720 and conductive vias 722. Each conductive pattern 720 laterally extends in one of the interlayer dielectric layers 716. In addition, each conductive via 722 vertically extends through one or more of the interlayer dielectric layers 716 to establish electrical contact with one or more of the conductive patterns 720, or to establish electrical contact with one of the signal lines in the memory array 10 (i.e., one of the first signal lines SL1 or one of the second signal lines SL2). The memory array 10 may be routed to some of the transistors 704 in the FEOL structure 700F through some of the conductive elements 718, and can be driven by a driving circuit including these transistors 704.

Although the conductive elements 718 below the memory array 10 are depicted as being connected to the conductive elements 718 above the memory array 10 through a long conductive via 722 penetrating through multiple interlayer dielectric layers 716, such long conductive via 722 may be alternatively replaced by a combination of short conductive vias 722 and some conductive patterns 720. The present disclosure is not limited to the arrangement of the conductive elements 718. Further, although not shown, passivation layer(s) and electrical connectors as chip inputs/outputs (I/Os) may be formed on the BEOL structure 700B.

Figure 8:
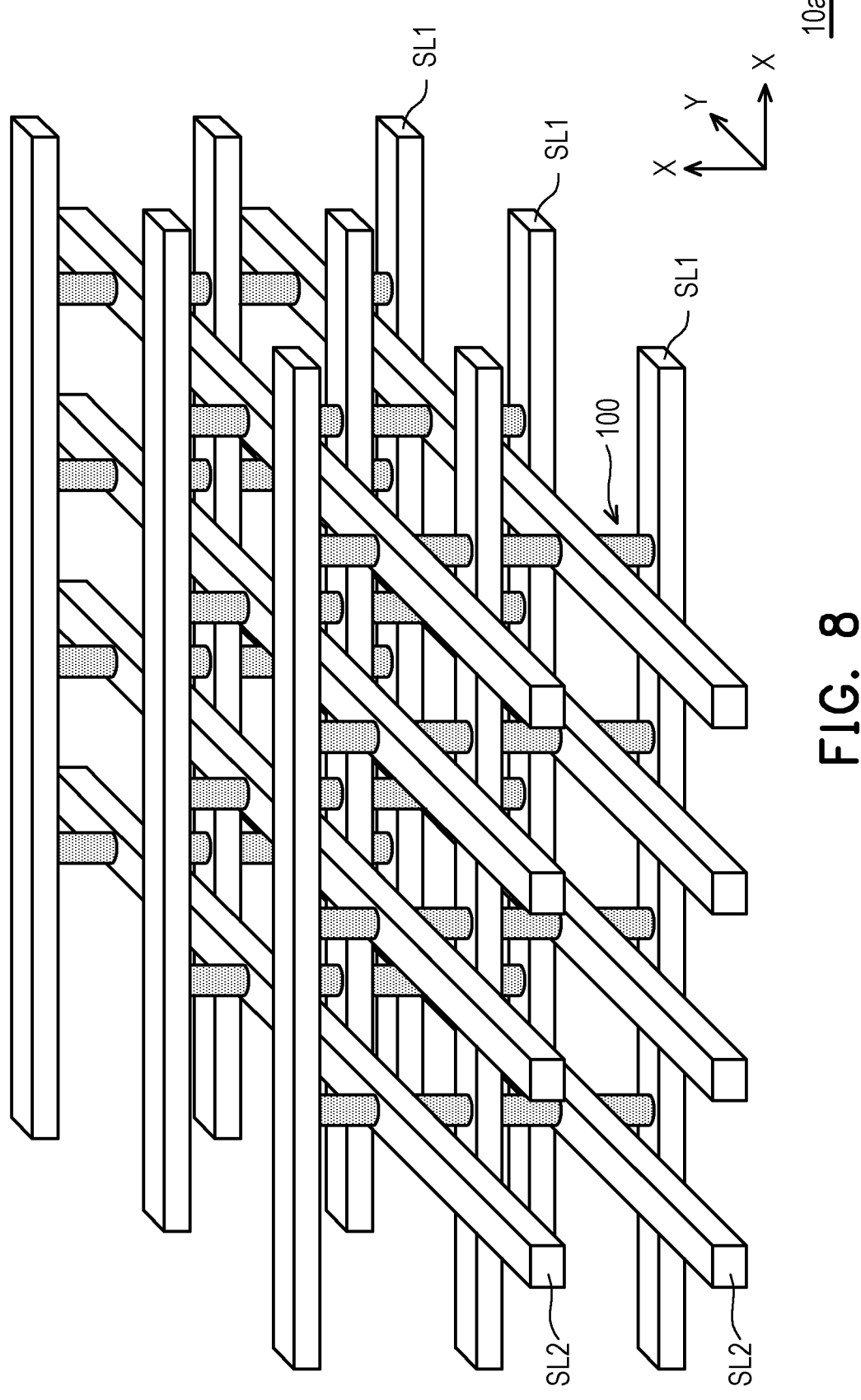
FIG. 8 is a schematic three-dimensional view illustrating a memory array, according to some embodiments of the present disclosure.

FIG. 8 is a schematic three-dimensional view illustrating a memory array 10a, according to some embodiments of the present disclosure.

The memory array 10 as shown in FIG. 1A includes the memory cells 100 arranged at a single horizontal level. On the other hand, the memory array 10a as shown in FIG. 8 has multiple horizontal levels. As shown in FIG. 8, layers of the memory cells 100 are stacked along a vertical direction. In addition, each layer of the memory cells 100 are coupled to vertically separated layers of signal lines (i.e., a layer of first signal lines SL1 and a layer of second signal lines SL2). Layers of the first signal lines SL1 and layers of the second signal lines SL2 may be alternatively arranged along a vertical direction. Accordingly, the memory cells 100 in some layers are coupled to underlying first signal lines SL1 and overlying second signal lines SL2, while the memory cells 100 in other layers are coupled to underlying second signal lines SL2 and overlying first signal lines SL1. In addition, vertically adjacent layers of the memory cells 100 may share the layer of signal lines extending in between. For instance, the bottommost layer of the memory cells 100 and the second bottommost layer of the memory cells 100 may share a layer of the second signal lines SL2 in between.

As being deployed along the vertical direction, the memory array 10a is no longer limited to two-dimensional design, and storage density can be significantly increased without increasing a footprint area of the memory array 10a. Each horizontal level of the memory array 10a may be defined by a layer of the memory cells 100 and the layers of the first and second signal lines SL1, SL2 connected thereto. Although the memory array 10*a* is depicted as having four horizontal levels, those skilled in the art may adjust an amount of the horizontal levels of the memory array 10*a*. For instance, the memory cell 10*a* may have two to ten horizontal levels. Further, as similar to the memory array 10 described with reference to FIG. 7, the memory array 10*a* shown in FIG. 8 may be embedded in a BEOL structure of a semiconductor chip as well.

Figure 9:
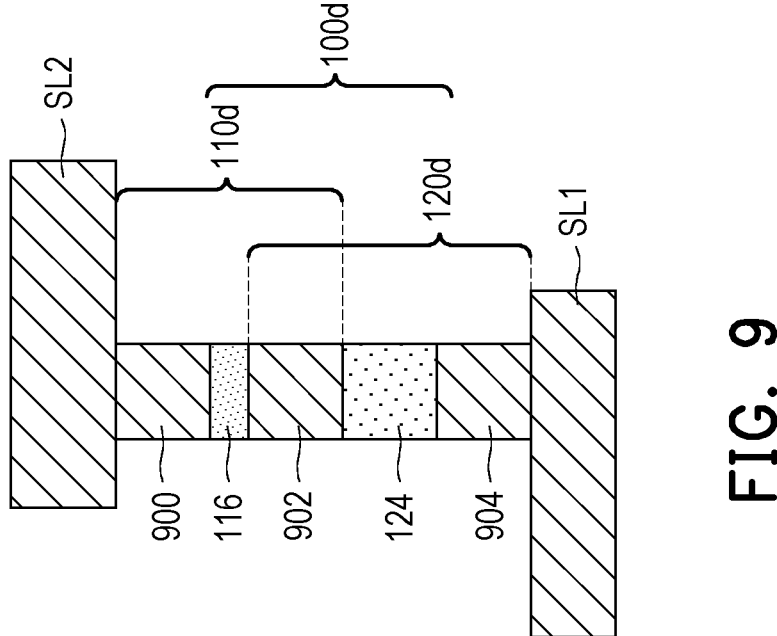
FIG. 9 is a cross-sectional view schematically illustrating a memory cell, according to some embodiments of the present disclosure.

FIG. 9 is a cross-sectional view schematically illustrating a memory cell 100*d*, according to some embodiments of the present disclosure. The memory cell 100*e* is similar to the memory cell 100 as described with reference to FIG. 1B. Therefore, only differences between the memory cells 100, 100*d* will be described. The same or the like parts between the memory cells 100, 100*d* would not be repeated again.

Referring to FIG. 9, a selector 110*d* is stacked on a resistance variable storage element 120*d* in a memory cell 100*d*. Electrodes 900, 902 at opposite sides of the switching layer 116 are functioned as top and bottom terminals of the selector 110*d*, respectively. The electrode 900 lying above the switching layer 116 and functioned as the top terminal of the selector 110*d* may extend to the signal line extending above the memory cell 100*d* (e.g., a second signal line SL2). On the other hand, the electrode 902 disposed below the switching layer 116 and functioned as the bottom terminal of the selector 110*d* may be shared with the resistance variable storage element 120*d*. In addition to the electrode 902 lying above the storage layer 124 and functioned as a top terminal of the resistance variable storage element 120*d*, the resistance variable storage element 120*d* may include an electrode 904 located below the storage layer 124 and functioned as its bottom terminal. The electrode 904 may extend from a bottom side of the storage layer 124 to the signal line extending on the memory cell 100*d* (e.g., a first signal line SL1). In some embodiments, the memory cell 100*d* is formed in a pillar shape. In these embodiments, sidewalls of the electrodes 900, 902, 904, the switching layer 116 and the storage layer 124 may be substantially coplanar with one another. In addition, a sidewall of such pillar structure is substantially flat from a top end of the pillar structure to a bottom end of the pillar structure. Further, the electrodes 900, 902, 904 may be similar to the electrodes 112, 114, 122 in terms of material candidates.

Further, as similar to the memory cell 100 as described with reference to FIG. 1A and FIG. 8, a plurality of the memory cells 100*d* may be arranged as a two-dimensional memory array or a three-dimensional memory array. Moreover, the two-dimensional memory array or the three-dimensional memory array may be embedded in a BEOL structure of a semiconductor chip, as described with reference to FIG. 7.

As above, a memory device is provided in the present disclosure includes a single-layer selector comprising a switching layer formed of a GeCTe compound, with a thickness of the switching layer ranging from about 1 nm to about 5 nm. Compare to a selector with a thicker switching layer, such as a thickness of ranging from about 10 nm to about 30 nm, the ultra-thin switching layer has an extremely low drift slope of the threshold voltage of the selector. In some embodiments, the selector is a multi-layer selector, including switching layers alternating with buffer layers, wherein a thickness of the switching layers is ranging from about 1 nm to about 5 nm. With the multi-layer structure of the selector, the drift slope and the threshold voltage of the selector can be engineered according to the desired application.

In an aspect of the present disclosure, a memory device is provided. The memory device comprises memory cells, each comprising: a resistance variable storage device; and a selector, stacked with the resistance variable storage device and coupled to the resistance variable storage device with a shared terminal, and comprising a switching layer formed of a chalcogenide compound, wherein a thickness of the switching layer is equal to or less than about 5 nm.

In another aspect of the present disclosure, a memory device is provided. The memory device comprises: memory cells, each comprising: a resistance variable storage device; and a two-terminal selector, stacked with the resistance variable storage device and coupled to the resistance variable storage device, and comprising alternately stacked switching layers and buffer layers.

In yet another aspect of the present disclosure, a memory device is provided. The memory device comprises: first signal lines, extending along a first direction; second signal lines, over the first signal lines and extending along a second direction; memory pillars, located at intersections of the first signal lines and the second signal lines, and respectively comprising a selector having a switching layer and a storage device overlapped with the selector and having a resistance variable layer, wherein and a thickness of the switching layer is equal to or less than about 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
memory cells, each comprising:
a resistance variable storage device; and
a two-terminal selector, stacked with the resistance variable storage device and coupled to the resistance variable storage device, and comprising alternately stacked switching layers and buffer layers, wherein a first group of the switching layers are formed of a first chalcogenide material, a second group of the switching layers are formed of a second chalcogenide material, and the switching layers in the first group are disposed on opposite sides of the switching layers in the second group without being interposing between the switching layers in the second group.

2. The memory device according to claim 1, wherein a thickness of each of the switching layers ranges from about 1 nm to about 5 nm.

3. The memory device according to claim 1, wherein a thickness of each of the switching layers ranges from about 1 nm to about 2 nm.

4. The memory device according to claim 1, wherein a thickness of each of the buffer layers ranges from about 1 nm to about 5 nm.

5. The memory device according to claim 1, wherein the switching layers are each configured to be switched between a high resistance and a low resistance, and a resistance of the buffer layers is less than the high resistance of the switching layers.

6. The memory device according to claim 5, wherein the resistance of the buffer layers is higher than or equal to the low resistance of the switching layers.

7. The memory device according to claim 1, wherein the buffer layers are each formed of a resistance variable material, and configured to be switched between a high resistance and a low resistance.

8. The memory device according to claim 1, wherein each of the memory cells further comprises an intermediate electrode as a shared terminal of the resistance variable storage device and the two-terminal selector.

9. The memory device according to claim 1, wherein the resistance variable storage device has a superlattice structure, and device stack of the switching layers and the buffer layers is directly coupled to the superlattice structure without an intermediate electrode in between.

10. The memory device according to claim 1, wherein an on-state resistance of the first chalcogenide material is lower than an on-state resistance of the second chalcogenide material.

11. The memory device according to claim 1, further comprising:

an interlayer dielectric layer between the memory cells; and a liner between the interlayer dielectric layer and one of the memory cells, wherein the liner surrounds the resistance variable storage device, the switching layers and the buffer layers.

12. The memory device according to claim 1, wherein a material of the buffer layers comprises SiC, WTe or CTe.

13. A memory device, comprising:

a selector, comprising stacked switching layers, wherein a first group of the switching layers comprises a first chalcogenide material, a second group of the switching layers comprises a second chalcogenide material, and the switching layers in the first group are disposed on opposite sides of the switching layers in the second group without being interposing between the switching layers in the second group.

14. The memory device according to claim 13, wherein the selector further comprises buffer layers alternately stacked with the switching layers.

15. The memory device according to claim 14, further comprising:

a liner, surrounding the switching layers and the buffer layers and extending onto a signal line.

16. A memory device, comprising:

a first electrode and a second electrode; and stacked switching layers, wherein a first group of the switching layers is formed of a first material, a second group of the switching layers is formed of a second material different from the first material, and the switching layers in the first group and the switching layers in the second group are disposed between the first electrode and the second electrode in a non-alternate arrangement.

17. The memory device according to claim 16, further comprising a plurality of buffer layers alternately arranged with the switching layers, wherein a material of the buffer layers comprises SiC, WTe or CTe.

18. The memory device according to claim 16, wherein a resistance of the second material is larger than a resistance of the first material.

19. The memory device according to claim 16, wherein the switching layers in the first group are disposed on opposite sides of the switching layers in the second group without being interposing between the switching layers in the second group.

20. The memory device according to claim 16, further comprising a plurality of buffer layers, wherein the switching layers in the first group are alternately arranged with the switching layers without being interposed by the switching layers in the second group.

* * * * *